US 12,278,578 B2

(12) United States Patent
Schmidt

(10) Patent No.: US 12,278,578 B2
(45) Date of Patent: Apr. 15, 2025

(54) ANALOG DYNAMIC TRIAC FIRING CIRCUIT

(71) Applicant: WHIRLPOOL CORPORATION, Benton Harbor, MI (US)

(72) Inventor: Mark C. Schmidt, St. Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 196 days.

(21) Appl. No.: 17/993,117

(22) Filed: Nov. 23, 2022

(65) Prior Publication Data

US 2024/0171105 A1   May 23, 2024

(51) Int. Cl.
| H02P 7/295 | (2016.01) |
| H02P 23/14 | (2006.01) |
| H03K 17/72 | (2006.01) |
| H03K 17/732 | (2006.01) |

(52) U.S. Cl.
CPC .................................. H02P 23/14 (2013.01)

(58) Field of Classification Search
CPC ......... H02P 23/14; H02P 7/295; H03K 17/72; H03K 17/732
USPC ...................................................... 318/445
See application file for complete search history.

(56) References Cited

U.S. PATENT DOCUMENTS

| 8,427,084 | B2 | 4/2013 | Kobayashi | |
| 9,270,221 | B2* | 2/2016 | Zhao | H02P 25/04 |
| 9,564,891 | B1 | 2/2017 | Bixby | |
| 9,915,442 | B2* | 3/2018 | Driussi | A47L 15/0049 |
| 10,439,529 | B2 | 10/2019 | Sun et al. | |
| 2004/0222824 | A1* | 11/2004 | Engelmann | H03K 17/725 |
| | | | | 327/110 |
| 2005/0271519 | A1* | 12/2005 | Hong | F04B 49/065 |
| | | | | 417/44.1 |
| 2010/0141231 | A1* | 6/2010 | Duchene | H02P 7/293 |
| | | | | 323/300 |
| 2016/0312395 | A1* | 10/2016 | Driussi | H02M 7/217 |
| 2018/0013282 | A1* | 1/2018 | Xu | H02H 3/087 |
| 2018/0054142 | A1* | 2/2018 | Williams | A47J 43/0716 |

FOREIGN PATENT DOCUMENTS

| WO | WO-8002895 A1 * | 12/1980 |
| WO | 2015129904 A1 | 9/2015 |
| WO | WO-2018010785 A1 * | 1/2018 |

* cited by examiner

*Primary Examiner* — Gabriel Agared
(74) *Attorney, Agent, or Firm* — Brooks Kushman, P.C.

(57) ABSTRACT

A method of regulating a motor, including monitoring an absolute voltage value across an anode and a cathode of a triode via an analog switching circuit, the triode being configured to facilitate power a motor, activating a gate of the triode via the circuit in response to the absolute voltage value being greater than a predetermined threshold, and deactivating the gate of the triode via a switching circuit in response to the absolute voltage value being less than the predetermined threshold.

11 Claims, 4 Drawing Sheets

ANALOG DYNAMIC TRIAC FIRING CIRCUIT

TECHNICAL FIELD

The disclosure relates to providing electrical power to an appliance motor.

BACKGROUND

Many electrical appliances include various motors to perform certain functions, such as open and shut doors, rotate parts, etc. triac devices are commonly used to switch and power control of alternating current (AC) systems. Triacs may be coupled to motors and be switched based on gate pulses at the triac. However, triacs may consume a larger amount of power while being triggered. Power draw may be further increased when a controller responsible for triggering the triac is unaware of the status of the triac, namely its execution readiness status. Thus, a more efficient power switching configuration may be appreciated in appliances.

SUMMARY

A method of regulating a motor, including monitoring an absolute voltage value across an anode and a cathode of a triode via an analog switching circuit, the triode being configured to facilitate power a motor, activating a gate of the triode via the circuit in response to the absolute voltage value being greater than a predetermined threshold, and deactivating the gate of the triode via a switching circuit in response to the absolute voltage value being less than the predetermined threshold.

An appliance including a motor configured to receive electrical energy from a power supply, a triode configured to provide converted electrical energy to the motor from a power supply in response to receiving of an uninterrupted activation signal, and an inhibition switch configured to interrupt the activation signal to the triode in response to a voltage value of the power supply being less than a predetermined threshold.

An inhibition circuit including a scaling circuit configured to map a voltage value input of a first value into a voltage value output of a second value, and a positive comparison circuit configured to compare the second value with a positive comparison voltage value and provide an electrical signal to an inhibition switch in response to the second value being less than the positive comparison voltage value, wherein the inhibition switch is configured to interrupt a trigger signal from a controller intended for a triac upon receipt of the electrical signal, such that that the interruption inhibits the triac from initiating operation.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In some examples, the increased power draw by triacs may be met, at least in part, by an increased power supply which allows the activation signal to be supplied for longer. While this may be considered to be wasting power, activation is ensured. In another example, a two-stage triac may be used, the second triac serving as a source of gate current to the first or main triac. While this may lower the power requirements, this solution also adds an additional high voltage component to the circuit. Yet another approach may be to use a controller to measure the current or voltage at the triac, but again, requires additional components and processing.

Described herein is an analog circuit that enables the triac triggering signal whenever the voltage across the triac is between a predefined range. In practice, when the triac is turned on, the voltage across the triac drops to zero. The analog circuit will then automatically turn off the triac triggering signals. This prevents additional power waste by avoiding trying to turn on a triac that is already on. The triggering of the triac will occur until the triac is turned on. Since the analog circuit only turns off the triac when the voltage across the triac turns to zero, the system will dynamically extend to the triggering signal for however long it takes to turn on the triac. Because of this, the triac pulse may automatically change based on the changes in the triac activation time. This may be used in part to temperature, motor variation, triggering current variation, triac variation, among other factors.

Typically, when the AC input voltage is close to zero, it is risky to turn on the triac. This is due in part to the instability caused around this voltage where the triac may turn on for a brief period before the zero cross, or the triac will turn on for the whole half-line cycle after the zero cross. The analog circuit prevents this instability by preventing the triggering of the triac close to a voltage of zero. Accordingly, the analog circuit blocks the triac trigger signal at times when the triac signal could cause an instability (e.g., when the AC voltage is at zero), while still allowing for the triac to be phase triggered under normal conditions and using existing methods.

Figure 1:
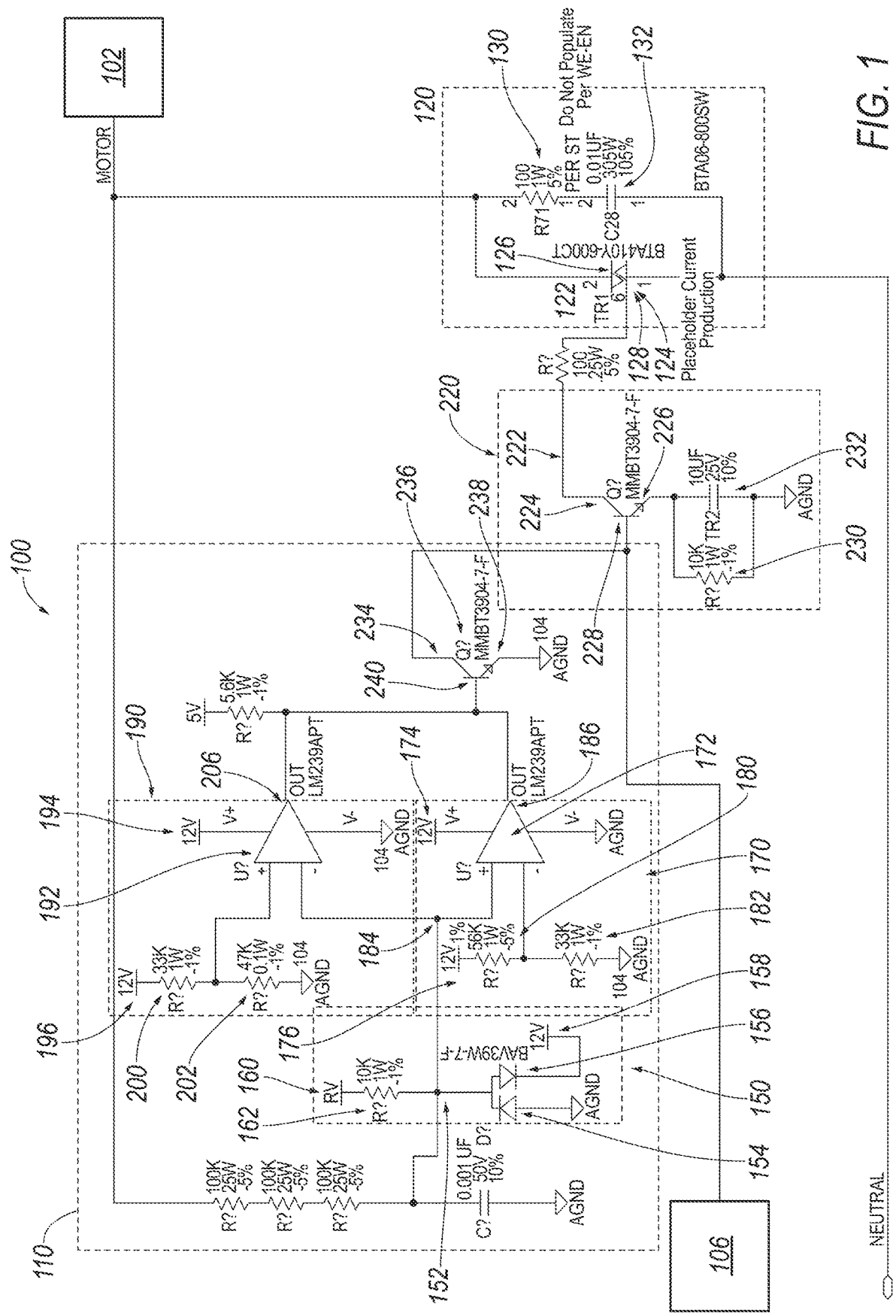
FIG. 1 illustrates an example circuit diagram for a power network for an appliance.

FIG. 1 illustrates an example circuit diagram for a power network 100 for an appliance. The power network 100 may be used to power a component of the appliance, such as a motor. While the example of a motor is described herein, other examples of components may be contemplated and enjoyed. For example, the power network 100 may power other appliance parts, including displays, doors, knobs, etc. The power network 100 may include various components to supply the appropriate voltage to a conversion circuit 120. The conversion circuit 120 may include a triode 122, a conversion resistor 130, and a conversion capacitor 132. The triode 122 may be configured as an amplifier, and in some examples, an oscillator. The triode may be a triac configured to provide for an alternating current bidirectional triac. The triode 122 may include an anode lead 124, a cathode lead 126, and a gate lead 128. The triode 122 may be configured to permit electrical current between the anode lead 124 and the cathode lead 126 in response to a reception of a triggering signal on the gate lead 128. In some embodiments, the gate lead 128 may require a constant electrical signal to maintain permission of electrical signal across the anode lead 124 and the cathode lead 126. Further, the triode 122 may be configured to inhibit electrical current between the anode lead 124 and the cathode lead 126 in response to a lack of a triggering signal on the gate lead 128.

The conversion circuit 120 may act as a converter. The conversion circuit 120 may be configured to convert a variety of parameters between the input and output of the conversion circuit 120. For example, the conversion circuit 120 may convert a voltage value, current value, frequency, phase, and other electrical parameters. As a converter, the conversion circuit 120 may convert a signal having a first set of parameters to a signal having a different second set of parameters. In one embodiment, the conversion circuit 120 may convert high voltage signal to a low voltage signal. For example, the conversion circuit 120 may convert a 480 volt signal to a 24 volt signal. The conversion circuit 120 may be bidirectional regarding direction of conversion. In some embodiments, the triac may be configured to vary its conversion. In such examples, the conversion circuit 120 may be capable of in response to a command from a controller. For example, the conversion circuit 120 may be configured to convert 480 volts into 24 volts in response to a first command from a controller, and further configured to convert 480 volts into 12 volts in response to a second command from the controller.

The power network 100 may contain a controller 106. While illustrated as one controller, the controller 106 may be part of a larger control system and may be controlled by various other controllers throughout the appliance. Controller 106 may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the appliance.

Control logic or functions performed by controller 106 may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based appliance, such as controller 106. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the appliance. The computer-readable storage devices or media may include one or more of a number of known physical devices which utilize electric, magnetic, and/or optical storage to keep executable instructions and associated calibration information, operating variables, and the like.

The controller 106 may be configured to send an activation pulse command (triggering pulse command) to a power supply 109. Upon reception of the triggering pulse command, the power supply 109 may send a triggering pulse to the triode 122. The pulse may be configured to signal the triode 122 to bridge a gate between the anode lead 124 of the triode 122 and the cathode lead 126 of the triode 122. In some embodiments, the controller 106 may use a pattern of pulse commands to partially control the frequency of the triode 122. Additionally or alternatively, the controller 106 may be configured to operate the triode 122 via the power supply 109 independent of the frequency of the electricity of a power supply. In such embodiments, the controller 106 may be configured to send a triggering signal command to the power supply 109 to initiate power to a motor without consideration AC wave.

As explained, the power network 100 may be configured to supply power to a motor 102. The motor 102 may be configured to convert electrical energy into mechanical energy. For example, the motor 102 may be configured to receive electrical energy from the power network 100 to generate mechanical motion, such as translation, rotation, etc. The motor 102 may be configured to receive AC electricity. The motor 102 may be arranged in various appliances, as specific appliance components, etc.

The power network 100 may include a scaling circuit 150. The scaling circuit 150 may be configured to scale voltages to a single voltage and provide a range for a series of voltages. For example, the scaling circuit 150 may be configured to map voltage values between 120 volts and −120 volts to voltage values between positive 12 volts and −12 volts. In other embodiments, the scaling from the scaling circuit 150 may be offset. For example, the scaling circuit 150 may be configured to map voltage values between 120 volts and −120 volts to 12 volts and 0 volts. Even further, the mapping from the scaling circuit 150 may be non-linear. For example, the mapping from the scaling circuit 150 may be configured to map values between 280 volts and −280 volts to 12 volts and 0 volts, wherein 5 volts represents 30 volts, and 12 volts represents 280 volts.

The scaling circuit 150 may define a scaling node 152. The scaling node 152 may be in electrical communication with an analog ground 104. The scaling circuit may include a first scaling diode 154 disposed between the scaling node 152 and the analog ground 104. The first scaling diode 154 may be aligned such that electrical current is biased towards the scaling node 152. The scaling node 152 may be in electrical communication with a first scaling voltage supply 158. In some embodiments, the first scaling voltage supply 158 may be configured to provide 12 volts. A second scaling diode 156 may be disposed between the scaling node 152 and the first scaling voltage supply 158. The second scaling diode 156 may be aligned such that electrical current is biased towards the first scaling voltage supply 158. The scaling node 152 may be in electrical communication with a second scaling voltage supply 160. In some embodiments, the second scaling voltage supply 160 may be configured to provide 5 volts. A scaling circuit resistor 162 may be disposed between the second scaling voltage supply 160 and the scaling node 152.

The power network 100 may include a positive comparison circuit 170. The positive comparison circuit 170 may be configured to compare a positive voltage to a positive comparison voltage value. The positive comparison circuit 170 may include a positive comparison op-amp 172. The positive comparison op-amp 172 may include a positive input lead and a negative input lead. The positive input lead of the positive comparison op-amp 172 may be in communication with the scaling node 152 of the scaling circuit 150. The negative input lead of the positive comparison op-amp 172 may be in direct electrical communication with a positive comparison power supply 176 and the analog ground 104. In such a configuration, the positive input lead of the positive comparison op-amp 172 may be in communication the positive comparison power supply 176 and the analog ground 104 are in parallel. Further, a first positive comparison circuit resistor 180 may be disposed between the positive input lead of the positive comparison op-amp 172 and the positive comparison power supply 176, and a second positive comparison circuit resistor 182 may be disposed between the positive comparison op-amp 172 and analog ground 104. The point in which the positive input lead of the positive comparison op-amp 172, the first positive comparison circuit resistor 180, and the second positive comparison circuit resistor 182 connect may define a positive comparison node 184. In some embodiments, the first positive comparison circuit resistor 180 and the second positive comparison circuit resistor 182 may act as a voltage divider. For example, if the positive comparison power supply 176 has a voltage value of 120 volts, the first positive comparison circuit resistor 180 has a resistor value of 100 ohms, and the second positive comparison circuit resistor 182 has a voltage value of 110 ohms, the positive comparison node 184 may have a voltage value of 80 volts.

The positive comparison op-amp 172 may further include a positive supply lead (e.g., 12V) and a negative supply lead (e.g., −12V). The positive supply lead of the positive comparison op-amp 172 may be in direct electrical communication with a positive input voltage supply 174. The negative supply lead of the positive comparison op-amp 172 may in communication with the analog ground 104. Even further, the positive comparison op-amp 172 may include a positive comparison output 186. If the voltage value of the positive input lead of the positive comparison op-amp 172 is greater than the voltage value of the negative input lead of the positive comparison op-amp 172, the positive comparison output 186 may output the voltage value of the positive input voltage supply 174. If the voltage value of the positive input lead is less than the voltage value of the negative input lead of the positive comparison op-amp 172, the positive comparison output 186 may output the voltage value of the negative supply lead of the positive comparison op-amp 172. In some embodiments, the voltage value of the negative supply lead will be the voltage value of the analog ground 104.

The power network 100 may include a negative comparison circuit 190. The negative comparison circuit 190 may be configured to compare a negative voltage to a negative comparison voltage value. The negative comparison circuit 190 may include a negative comparison op-amp 192. The negative comparison op-amp 192 may be include a negative input lead and a negative input lead. The negative input lead of the negative comparison op-amp 192 may be in direct electrical communication with the scaling node 152 of the scaling circuit 150. The negative input lead of the negative comparison op-amp 192 may be in direct electrical communication with a negative comparison power supply 196 and the analog ground 104. In such a configuration, the negative input lead of the negative comparison op-amp 192 may be in electrical communication the negative comparison power supply 196 and the analog ground 104 are in parallel. Further, a first negative comparison circuit resistor 200 may be disposed between the negative input lead of the negative comparison op-amp 192 and the negative comparison power supply 196, and a second negative comparison circuit resistor 202 may be disposed between the negative comparison op-amp 192 and analog ground 104. The point in which the negative input lead of the negative comparison op-amp 192, the first negative comparison circuit resistor 200, and the second negative comparison circuit resistor 202 connect may define a negative comparison node 204. In some embodiments, the first negative comparison circuit resistor 200 and the second negative comparison circuit resistor 202 may act as a voltage divider. For example, if the negative comparison power supply 196 has a voltage value of 120 volts, the first negative comparison circuit resistor 200 has a resistor value of 100 ohms, and the second negative comparison circuit resistor 202 has a voltage value of 110 ohms, the negative comparison node 204 may have a voltage value of 80 volts.

The negative comparison op-amp 192 may further include a positive supply lead and a negative supply lead. The positive supply lead of the negative comparison op-amp 192 may be in direct electrical communication with a negative input voltage supply 194. The negative supply lead of the negative comparison op-amp 192 may in direct electrical communication with the analog ground 104. Even further, the negative comparison op-amp 192 may include a negative comparison output 206. If the voltage value of the positive input lead of the negative comparison op-amp 192 is greater than the voltage value of the negative input lead of the negative comparison op-amp 192, the negative comparison output 206 may output the voltage value of the negative input voltage supply 194. If the voltage value of the positive input lead is less than the voltage value of the negative input lead of the negative comparison op-amp 192, the negative comparison output 206 may output the voltage value of the negative supply lead of the negative comparison op-amp 192. In some embodiments, the voltage value of the negative supply lead will be the voltage value of the analog ground 104.

The power network 100 may include a triode pulse switch circuit 220. The triode pulse switch circuit 220 may include a triode pulse switch 222. The triode pulse switch 222 may be defined by a triode pulse base 228, a triode pulse collector 224, and a triode pulse emitter 226. The triode pulse base 228 may be in communication with the controller. Upon receipt of a triggering signal from the controller upon the triode pulse base 228, the triode pulse switch 222 may be configured to allow the triode 122 to permit electrical signal across the anode lead 124 and cathode lead 126. In some embodiments, this may be via switching the triode pulse switch 222 on and creating a path from the power grid through the gate lead 128 of the triode, the triode pulse collector 224 and the triode pulse emitter 226, to the analog ground 104. Even further, the triode pulse switch circuit 220 may include a triode pulse resistor 230 and a triode pulse capacitor 232. The triode pulse resistor 230 and triode pulse capacitor 232 may be disposed in parallel between the triode pulse switch 222 and the analog ground 104.

The power network 100 may include an inhibition switch 234. The inhibition switch 234 may include an inhibition switch collector 236, an inhibition switch emitter 238, and an inhibition switch base 240. The inhibition switch emitter 238 may be in communication with the analog ground 104. The inhibition switch collector 236 may be in direct electrical communication with the triode pulse base 228. The inhibition switch 234 may be configured such that upon receipt of a signal at the inhibition switch base 240, the inhibition switch 234 inhibits the signal from reaching the triode pulse switch circuit 220. This may be achieved by the inhibition switch 234 placing the output from the power supply 109 in direct electrical communication with the analog ground 104. Thus, the triode pulse switch circuit 220 does not receive the triggering pulse.

Figure 2:
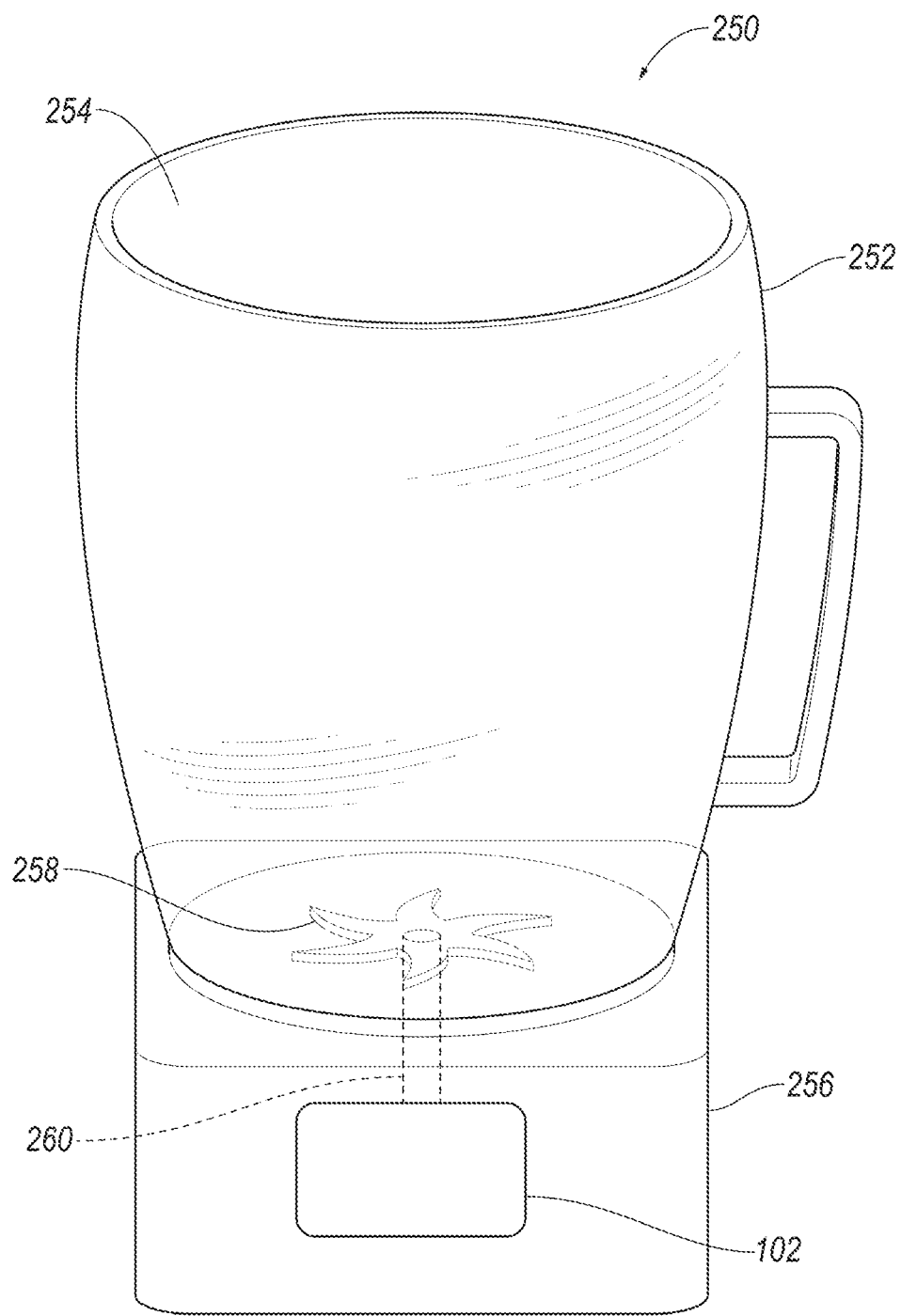
FIG. 2 illustrates an example blender including the power network of FIG. 1.

FIG. 2 illustrates an example blender including the power network 100 of FIG. 1. The blender is merely an example and another power appliances, small appliance, etc., may be contemplated. For example, in other examples, the power network 100 may be disposed within a food processor. The blender 250 may include a blender cup 252, blender lid 254, and blender base 256. The blender cup 252 may further include a set of blender blades 258. The set of blender blades 258 may be configured to blend food material. The blender lid 254 may be configured to seal the blender cup 252 while the set of blender blades 258 act to blend food material. The blender base 256 may act as a housing. The blender cup 252 may be configured to removably attach to the blender base 256. While the blender cup 252 is atop the blender base 256, the set of blender blades 258 may be coupled to the motor 102 housed within the blender base 256 via a blender shaft 260. As such, the set of blender blades 258 may be rotationally coupled to and driven by the motor 102. In this embodiment, the motor 102 may be driven by the power network 100.

Figure 3:
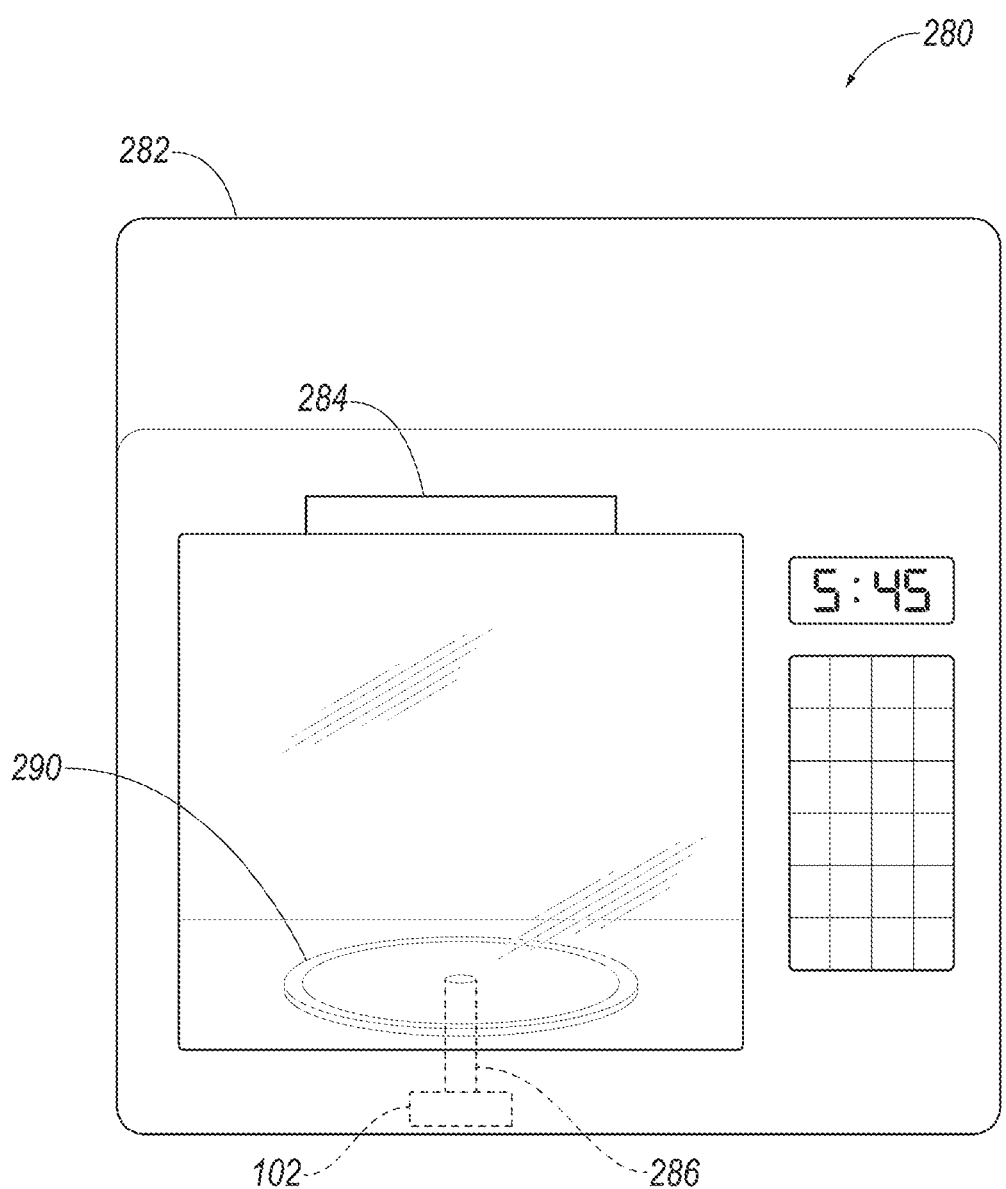
FIG. 3 illustrates the power network within a microwave including the power network of FIG. 1.

FIG. 3 illustrates an example microwave oven 280 including the power network 100 of FIG. 1. The microwave oven 280 may be configured to cook food material using electro-magnetic radiation. The microwave oven 280 may include a microwave enclosure 282. The microwave enclosure 282 may serve as an encasing to focus electro-magnetic radiation upon food. Further, the microwave enclosure 282 may prevent materials from escaping during the cooking process. The microwave oven 280 may further include a wave generator 284. The wave generator 284 may be in fluid communication with the microwave enclosure 282. The wave generator 284 may be configured to introduce electro-magnetic radiation into the microwave enclosure 282. The microwave oven 280 may further include a microwave plate 290. The microwave plate 290 may be configured to sit atop a microwave rotating shaft 286. The microwave plate 290 may be configured to rotate within the microwave enclosure 282 via rotational energy provided to the plate via the microwave rotating shaft 286. The microwave rotating shaft 286 may be coupled and driven to the motor 102. In such embodiments, the motor 102 may be regulated by the power network 100.

Figure 4:
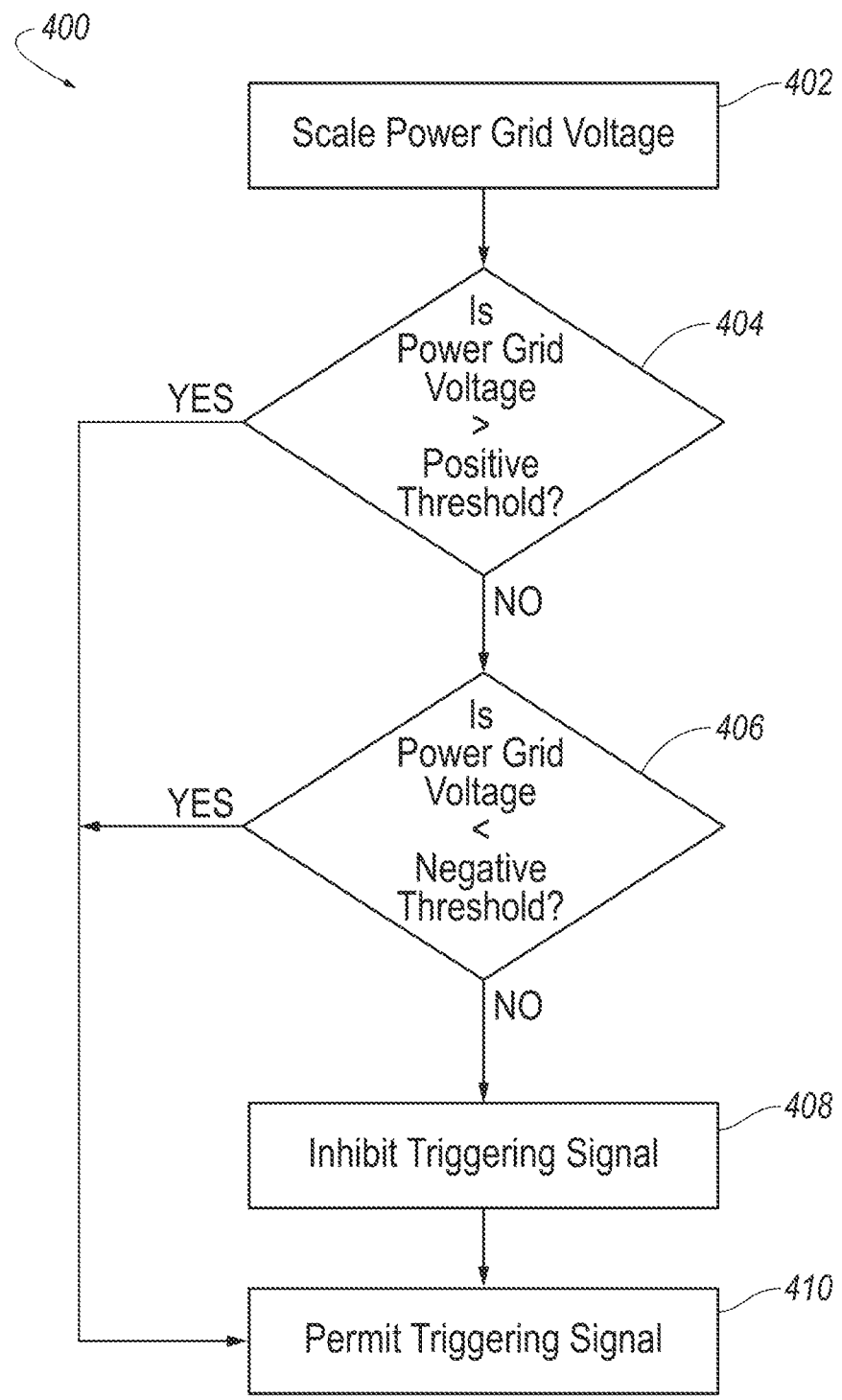
FIG. 4 illustrates a process for the power network of FIG. 1.

FIG. 4 illustrates a process 400 of the power network 100 of FIG. 1. The process 400 begins with a scale voltage step 402. In the scale voltage step 402, the inhibition circuit 110 will scale the voltage received across the anode lead 124 and cathode lead 126. Next in the compare positive voltage value step 404, the inhibition circuit 110 will compare the voltage value of the scaled voltage to a positive predetermined threshold. In some embodiments, the positive threshold may represent a cut-off voltage. An example of a positive threshold may be 30 volts. If the voltage value of across the anode lead 124 and cathode lead 126 is greater than the positive threshold, the process 400 will move to apply permission of triggering signal step 410 and allow permission of a triggering signal to the triode pulse base 228. If the voltage across the anode lead 124 and cathode lead 126 is less than the positive threshold, the process 400 will move to a compare negative voltage value step 406, in which the scaled voltage value is compared to a negative threshold. In some embodiments, the negative threshold may represent a cut-off voltage. An example of a negative threshold may be −30 volts. Even further, absolute value of both the positive threshold and the negative threshold may be equal. In such an embodiment, an example would be a positive threshold of 30 volts and a negative threshold of −30 volts. If the voltage value across the anode lead 124 and cathode lead 126 are less than the negative threshold, the process 400 will move to the apply permission of triggering signal step 410. If however, the voltage value across the anode lead 124 and cathode lead 126 are greater than the negative threshold, the process 400 will move to a apply inhibition of triggering signal step 408, and inhibit the triggering of the triode pulse base 228. Further, the absolute voltage value is thus compared to the predetermined threshold.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, C#, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of regulating a motor, comprising:
  map a voltage value input of a first value into a voltage value output of a second value across a triode via an analog switching circuit, the triode being configured to facilitate power to the motor;
  compare the second value with a positive comparison voltage value;
  provide an electrical signal to an inhibition switch in response to the second value being less than the positive comparison voltage value and greater than a predetermined threshold,
  interrupt a trigger signal from a controller intended for a triac upon receipt of the electrical signal to inhibit the triac from initiating operation; and
  compare the second value with a negative comparison voltage value, wherein the positive and negative comparisons include using values from a positive supply lead and negative supply lead; and provide an electrical signal to the inhibition switch in response to the second value being greater than the negative comparison voltage value.

2. The method of claim 1, wherein the motor is arranged within an appliance.

3. The method of claim 2, wherein the appliance is one of a blender, mixer, and a microwave.

4. The method of claim 1, wherein the triode is configured to operate independent of electrical frequency.

5. An inhibition circuit comprising:
   a scaling circuit configured to map a voltage value input of a first value into a voltage value output of a second value;
   a positive comparison circuit configured to compare the second value with a positive comparison voltage value and provide an electrical signal to an inhibition switch in response to the second value being less than the positive comparison voltage value,
   wherein the inhibition switch is configured to interrupt a trigger signal from a controller intended for a triac upon receipt of the electrical signal, such that that the interruption inhibits the triac from initiating operation; and
   a negative comparison circuit configured to compare the second value with a negative comparison voltage value, and further configured to provide an electrical signal to the inhibition switch in response to the second value being greater than the negative comparison voltage value,
   wherein the positive and negative comparisons include using values from a positive supply lead and negative supply lead.

6. The inhibition circuit of claim 5, wherein the triac is configured to operate a motor.

7. The inhibition circuit of claim 5, wherein the triac is configured to operate a motor disposed within an appliance.

8. The inhibition circuit of claim 5, wherein the triac is configured to operate a motor disposed within at least one of a blender, mixer, and a microwave.

9. The inhibition circuit of claim 5, wherein an absolute voltage value of the positive comparison voltage value is equal to an absolute voltage value of the negative comparison voltage value.

10. The inhibition circuit of claim 5, wherein the controller is configured to send a triggering signal to the triac independent of the frequency of electricity of a power supply.

11. The inhibition circuit of claim 5, wherein the controller is configured to delay a triggering signal to the triac based on the frequency of the electricity of a power supply, and
    wherein the inhibition switch is configured to inhibit the triggering signal in response to frequency of the electricity of the power supply.

* * * * *